United States Patent [19]
Lu

[11] Patent Number: 5,652,773
[45] Date of Patent: Jul. 29, 1997

[54] DIGITAL PHASE-LOCKED LOOP FOR DATA SEPARATION

[75] Inventor: Chau-Her Lu, Tainan, Taiwan

[73] Assignee: Holtek Microelectronics, Inc., Hsin-Chu, Taiwan

[21] Appl. No.: 594,596

[22] Filed: Jan. 31, 1996

[51] Int. Cl.$^6$ .............................. H04L 7/00; H04L 25/36; H04L 25/40
[52] U.S. Cl. ................. 375/371; 375/373; 375/376
[58] Field of Search .............................. 375/371, 377, 375/373, 376, 215, 294, 327, 359; 327/147, 156, 307, 325, 360

[56] References Cited

U.S. PATENT DOCUMENTS

| | | | |
|---|---|---|---|
| 4,472,818 | 9/1984 | Zapisek et al. | 375/371 |
| 4,796,280 | 1/1989 | Nesin et al. | 375/371 |
| 4,808,884 | 2/1989 | Hull et al. | 375/376 |
| 4,975,930 | 12/1990 | Shaw | 375/376 |
| 5,553,100 | 9/1996 | Saban et al. | 375/373 |

*Primary Examiner*—Stephen Chin
*Assistant Examiner*—Betsy L. Deppe

[57] ABSTRACT

A digital phase-locked loop locks to the reference clock signal in the encoded input data stream and separates the reference clock signal from the actual data signal. The digital phase-locked loop includes a digital oscillator that generates a pulse train with a period continuously adjusted in accordance with time variations in the input data stream so as to maintain the regenerated data in proper phase relationship with the reference clock. The digital phase-locked loop also contains a predict phase generator that generates a predict phase with a fraction part in order to improve the precision of phase adjustment without increasing frequency of the system clock. The circuit also includes a digital low pass filter that generates a first order predict phase, of which the small transient phase variation in the reference clock is removed such that the frequency stability of the recovered reference clock is enhanced. The data window and data regenerator of the circuit generates the data window signal to help separation of reference clock from actual data and regenerated data signal that is more evenly spread in time and more stable in frequency.

5 Claims, 13 Drawing Sheets

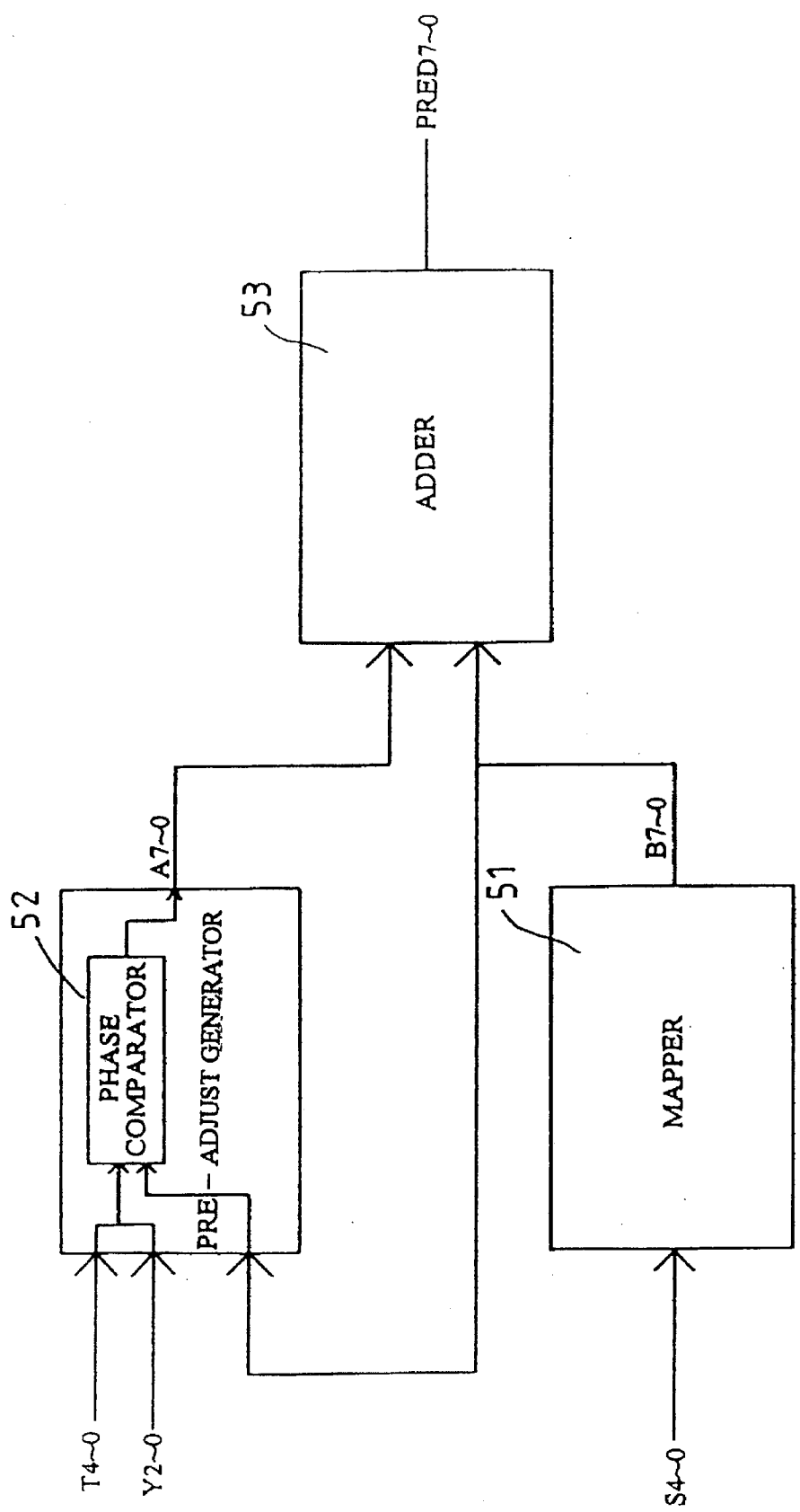
F I G. 8

DIGITAL PHASE-LOCKED LOOP FOR DATA SEPARATION

FIELD OF THE INVENTION

The present invention relates generally to a phase-locked loop circuit, and more particularly to a digital phase-locked loop circuit for separating data and reference clock from an encoded digital data stream.

BACKGROUND OF THE INVENTION

Digital data is usually stored on a floppy disk, a hard disk or a magnetic tape in different codes or formats. It is well known that a reference clock signal is usually encoded along with the actual data, such as in a floppy disk or a magnetic tape. As a result, a data separator is required to separate the reference clock signal from the actual data and to decode the stored data with the help of the reconstructed reference clock.

Due to the noise and jitters that always accompany the data stream from the disk, and variations in the rotation speed of the disk, the data and the reference clock signals will change from time to time. Consequently, the data separator must be able to accommodate for the changes in the data rate and remain synchronized to the reference clock signal. This task is accomplished in conventional data separators with a phase-locked loop.

In early days analog phase-locked loops were implemented in data separators, which generally provided acceptable performances. The disadvantages of analog phase-locked loops, however, include high noise level, discrete components that need to be adjusted manually, large circuit size and low reliability. With the advancement of the VLSI technology, therefore, analog phase-locked loops are almost completely replaced by digital phase-locked loops.

A conventional digital phase-locked loop typically employs a high speed counter to generate a clock signal that can be locked to the reference clock signal in the input data stream. The phase of the clock signal can be adjusted to track the variations in time of the reference clock signal. The precision of the reconstructed clock signal is usually determined by the speed of the system clock. The higher the system clock rate, the finer the time steps in variation of the reference clock that the system can resolve. Therefore, it is usually unavoidable to adopt a system clock that is much higher in frequency than the data stream. As a result, cost and power consumption of the system increase significantly.

It is therefore desirable to design a digital phase-locked loop circuit with a system clock frequency about 12 to 16 times that of the data stream, while improving the resolution of the phase of the reconstructed reference clock without further increasing the system clock rate. Zapisek et al. disclosed a data separator in U.S. Pat. No. 4,472,818, issued Sep. 18, 1984, which implemented a digital phase-locked loop that specifically generates a reconstructed reference clock signal having the same phase as the reference clock signal of the input data stream. The main disadvantage with the above invention is its poor precision of the phase of the reconstructed reference clock.

A data separator with a digital phase-locked loop that increases precision and accuracy of the recovered reference clock was disclosed by Nesin et al. in U.S. Pat. No. 4,796,280, issued Jan. 3, 1989. The digital phase-locked loop of the above invention uses half period of the system clock to increase the precision of the phase information of the input data stream and exactly simulates the function of an analog phase-locked loop. The circuit also generates a reconstructed reference clock that is synchronized with the input data stream with smallest phase differences possible. The main disadvantage with the above invention is that, by using the half period of the system clock, the precision is increased by only one bit, or equivalent to doubling the frequency of the system clock.

In order to further increase the precision of the digital phase-locked loop without increasing the frequency of the system clock, it is one of the objects of the present invention to provide a circuit that implements a fraction phase predictor to increase the phase information of the input data with a 3-bit fraction phase that can significantly improve the accuracy of the recovered reference clock signal.

SUMMARY OF THE INVENTION

The primary object of the present invention is to provide a digital phase-locked loop for data separation that resolves the problems present in the operation of current data separators and that provides increased resolution and accuracy without requiring a much higher operating system clock rate.

It is a further object of the present invention to provide a digital phase-locked loop circuit that detects the phase variations in the input data and generates a corrected and stabilized reference clock and actual data with less jitters than the original data stream.

It is another object of the present invention to provide a digital phase-locked that can accommodate for the long term frequency change in the input data stream and remain synchronized.

It is yet another object of the present invention to provide a digital data separator circuit that is simple enough such that it can be integrated into an integrated circuit in order to reduce system cost and enhance system reliability.

To these ends, the present invention provides a digital phase-locked loop that develops a first order predict phase as well as a fraction phase for adjustment of the phase of the digital oscillator that produces a regenerated reference clock and data that are corrected in phase. The digital phase-locked loop includes an input phase register that latches the count value of the digital oscillator, the count value representing the phase of the input data or reference clock. The digital phase-locked loop also includes a phase detector that compares the input phase with the predict phase in order to control a digital low pass filter for smoothing out the jitters in the input data stream. The digital phase-locked loop further includes a predict phase generator that produces a predict phase with a fraction part to adjust the period of the digital oscillator with improved resolution without requiring a higher system clock rate.

BRIEF DESCRIPTION OF THE DRAWING

To the accomplishment of the above and such further objects as may hereinafter appear, the circuit diagrams showing the circuit comprised in the improved digital phase-locked loop in accordance with the present invention are described briefly.

FIG. 8 is a schematic block diagram of the predict phase generator of the improved digital phase-locked loop of FIG. 1;

DETAILED DESCRIPTION OF THE PREFERRED EMBODIMENT

Figure 1:
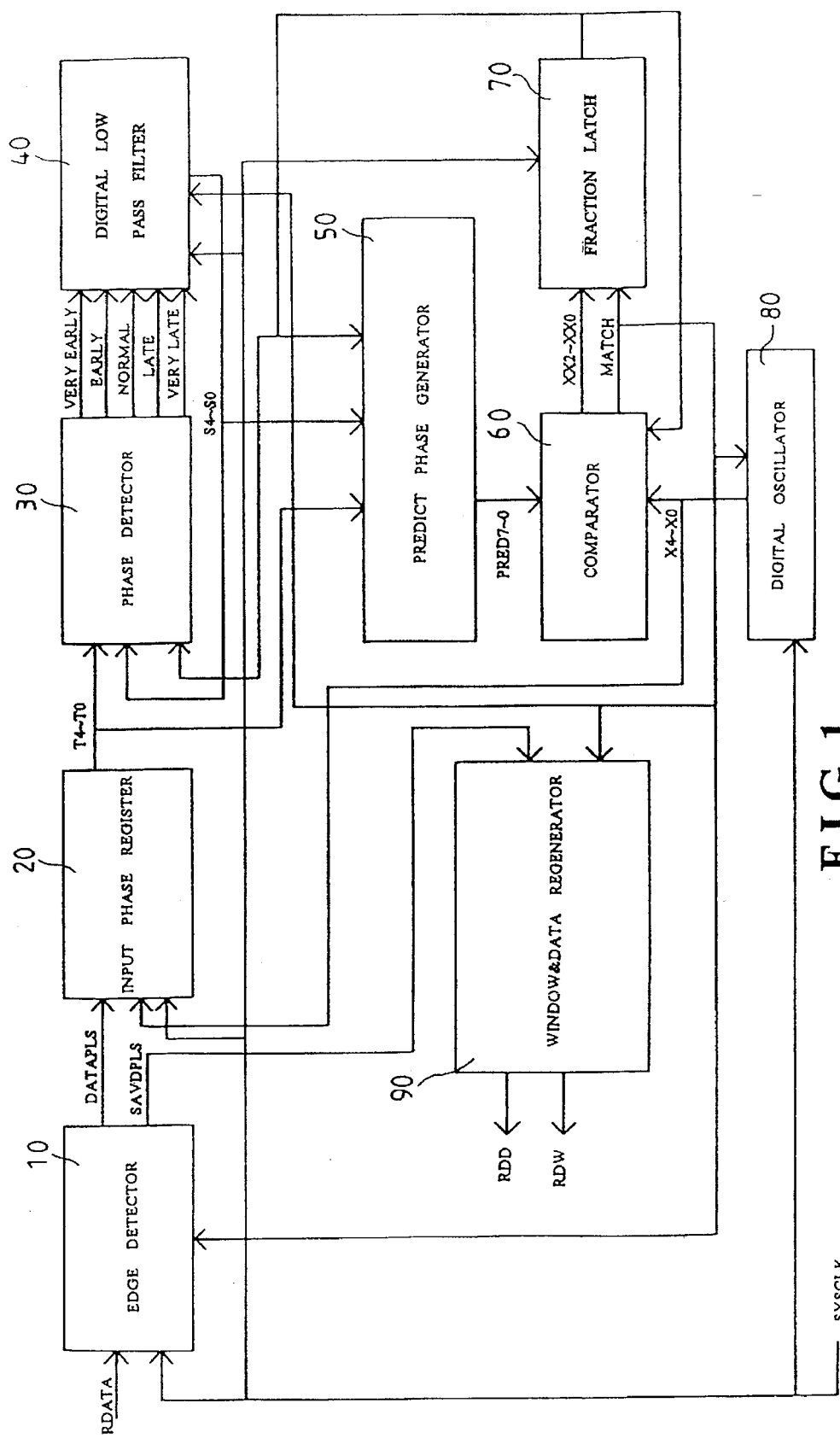
FIG. 1 is a schematic block diagram of an improved digital phase-locked loop in accordance with an embodiment of the present invention.
Figure 2:
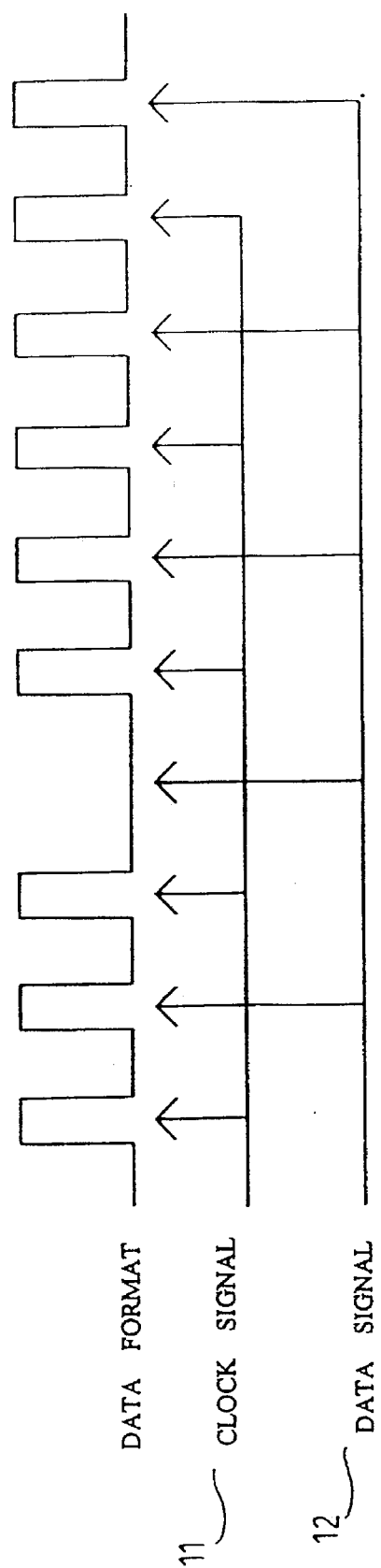
FIG. 2 is a timing diagram of the input signal and reference clock signal for the purpose of providing a clearer understanding of the operation principle of the data separation objective of the invention.

A digital phase-locked loop circuit, as in the embodiment illustrated in FIG. 1, receives an encoded input data stream RDATA, such as from a floppy disk at the input of the edge detector 10. The input data RDATA typically includes both reference clock signal 11 and data pulses 12 in a common data stream, which are illustrated in FIG. 2. The edge detector 10 is capable of generating a DATAPLS and a SAVDPLS signal when it detects a rising edge in the input data stream DATA.

Figure 5:
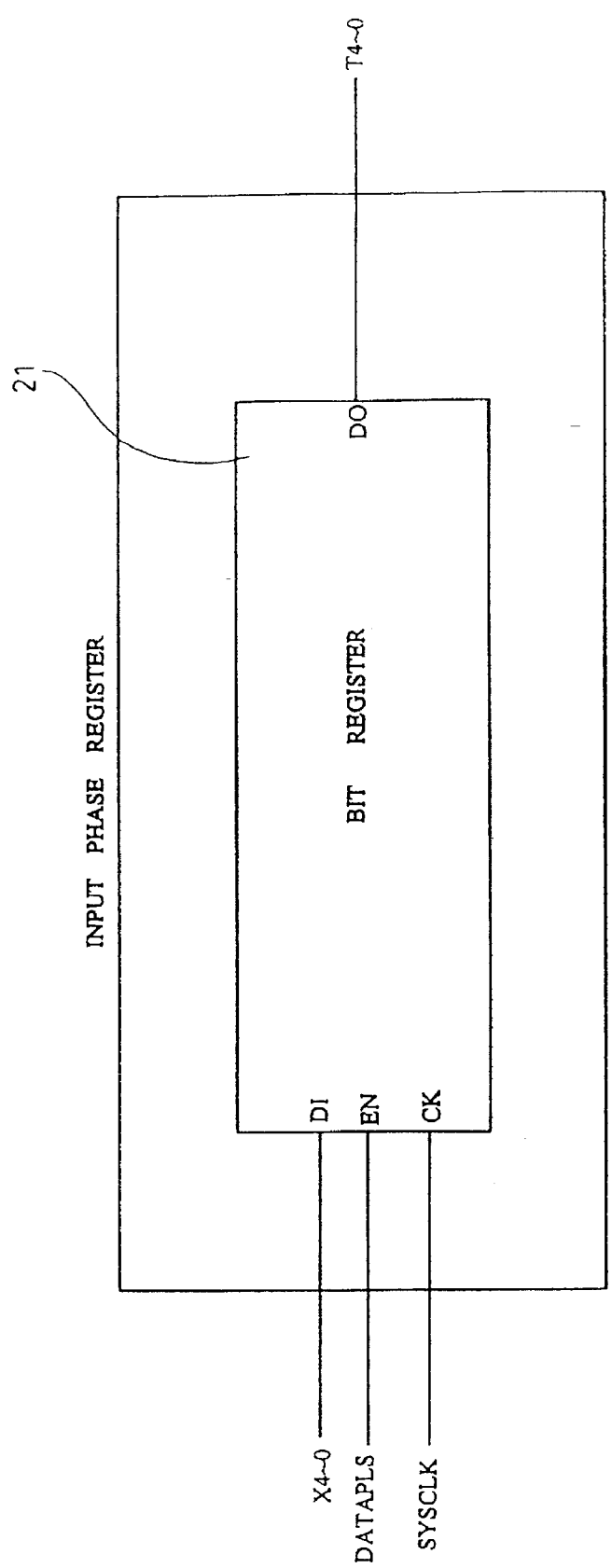
FIG. 5 is a schematic block diagram of the input phase register of the improved digital phase-locked loop of FIG. 1.
Figure 6:
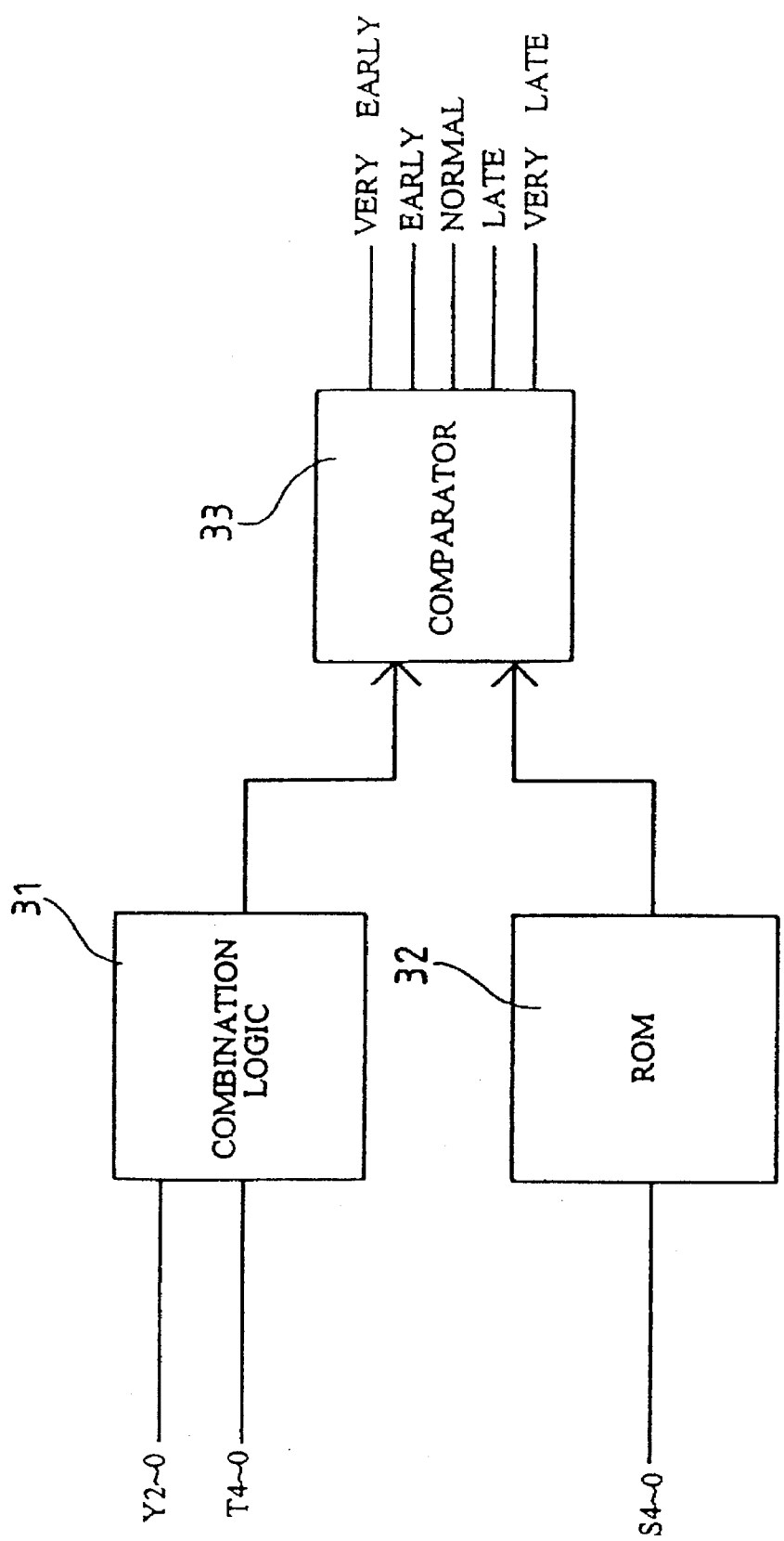
FIG. 6 is a schematic block diagram of the phase detector of the improved digital phase-locked loop of FIG. 1.

The DATAPLS signal is applied as one input to an input phase register 20, which is shown in greater detail in FIG. 5. The oscillator phase X4~X0 from a digital oscillator 80 is latched into the input phase register 20 at the DATAPLS pulse and the input phase register corresponding generates a phase signal T4~T0, which represents the phase of the input pulse RDATA. Input phase T4~T0 is sent to a phase detector 30, which, as described in more detail in FIG. 6, compares the combination of input phase T4~T0 and a fraction phase signal Y2~Y0 generated by a fraction latch 70 with a first order predict phase signal S4~S0, which is generated by a digital low pass filter 40, and generates VERY EARLY, EARLY, NORMAL, LATE and VERY LATE signals according to the differences between the two phases. Input phase T4~T0 is also applied as one input to a predict phase generator 50.

The five signals VERY EARLY, EARLY, NORMAL, LATE and VERY LATE are applied as inputs to the digital low pass filter 40, which is explained in more detail with reference to FIG. 7. Digital low pass filter 40 is adjusted by the aforementioned five signals and generates the first order predict phase S4~S0, which is sent to phase detector 30 and predict phase generator 50.

As described in greater detail in FIG. 8, the predict phase generator 50 combines the latched input phase T4~T0 with the fraction phase Y2~Y0 and compares the result with the first order predict phase S4~S0 in order to generate a predict phase signal PRED7~0 that is closer to the actual phase of the input data RDATA.

The oscillator phase X4~X0 from the digital oscillator 80, the fraction phase Y2~Y0 from the fraction latch 70 and the predict phase PRED7~0 from the predict phase generator 50 are applied as inputs to a comparator 60, which is described in greater detail below with reference to FIG. 9. The comparator 60 compares the combination of oscillator phase X4~X0 and fraction phase Y2~Y0 with PRED7~0 and generates a MATCH pulse when the two numbers are close enough. The MATCH pulse is sent as one input to the fraction latch 70, the digital oscillator 80 and a window and data regenerator 90. The difference between the above two numbers inside comparator 60 is the fraction phase difference signal XX2~XX0, which is applied as another input to the fraction latch 70.

Figure 10:
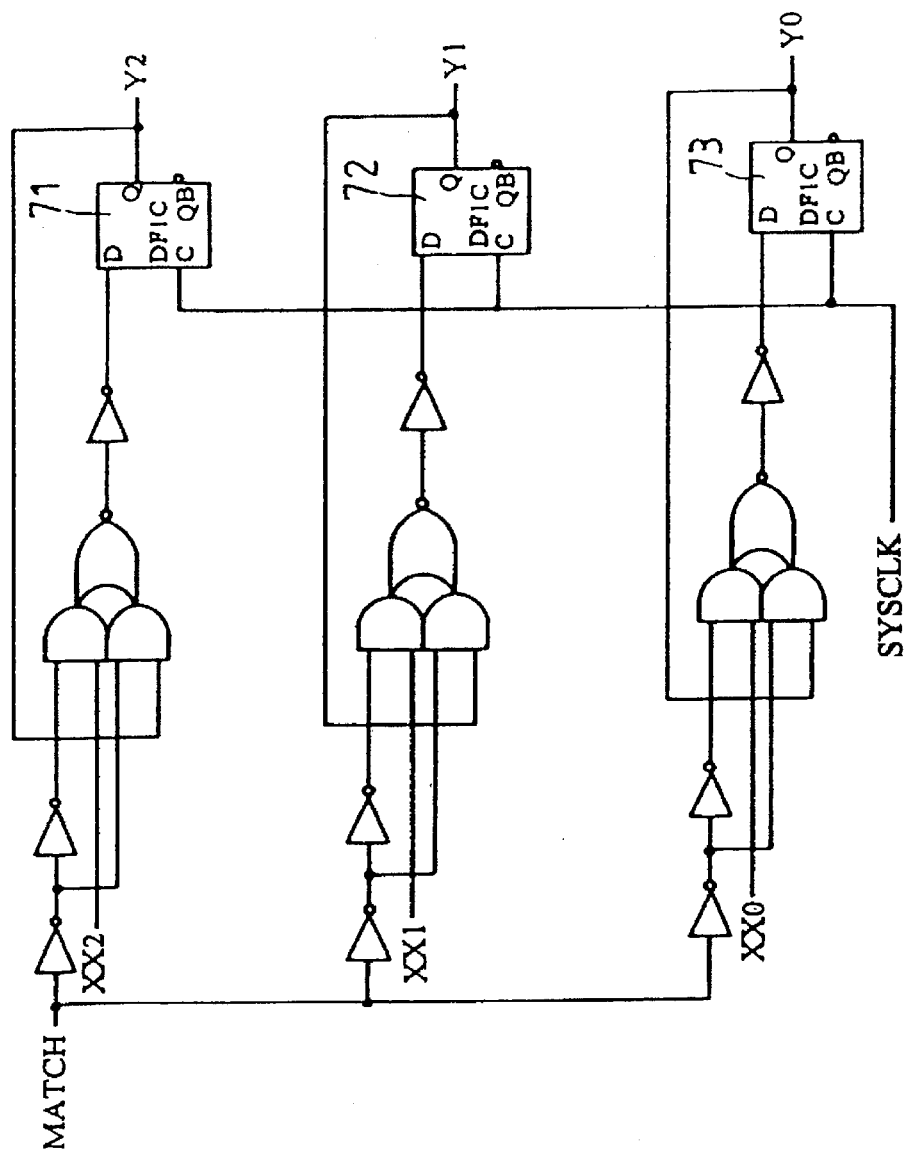
FIG. 10 is a schematic block diagram of the fraction latch of the improved digital phase-locked loop of FIG. 1.

As explained in greater detail in FIG. 10, the fraction latch 70 latches the fraction phase difference XX2~XX0 at the MATCH pulse and generates the fraction phase signal Y2~Y0, which is sent to the predict phase generator 50 and the comparator 60.

Figure 11:
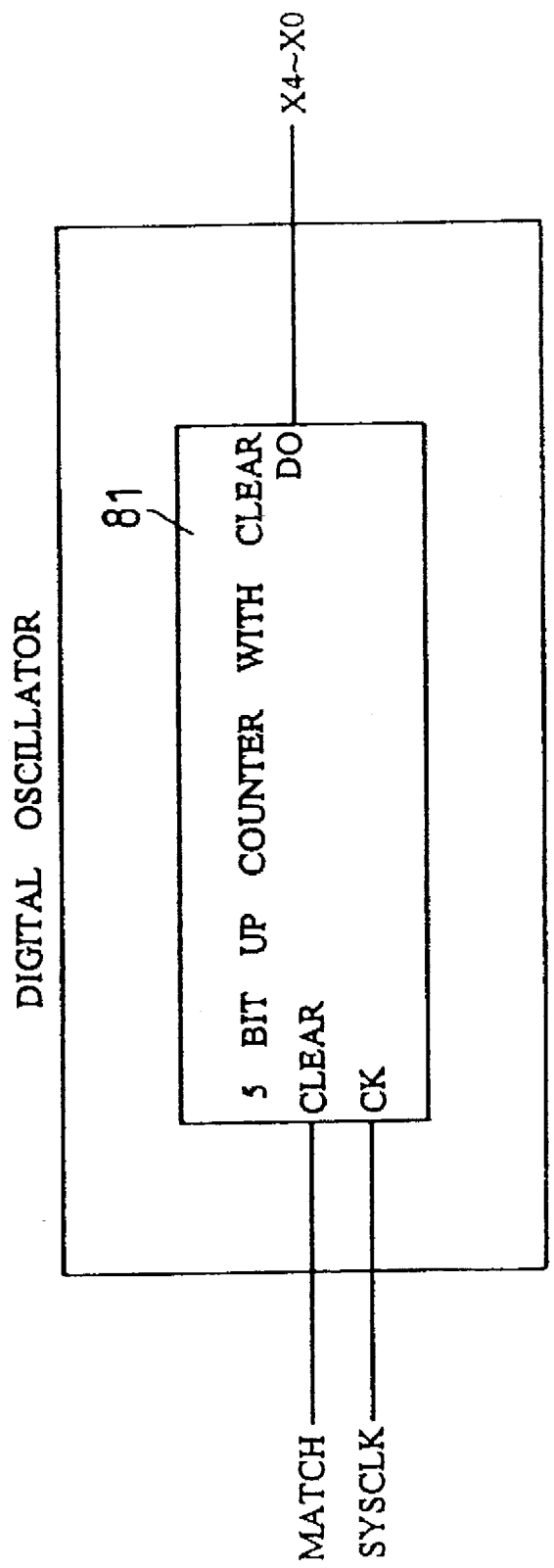
FIG. 11 is a schematic block diagram of the digital oscillator of the improved digital phase-locked loop of FIG. 1.

As explained in more detail in FIG. 11, the digital oscillator 80 includes a programmable up counter in order to generate an integer oscillator phase signal X4~X0. When the MATCH pulse activates, the up counter is reset to zero and starts counting upwards again. As a result, the comparator 60 can generate the MATCH signal repeatedly with a period continuously modified according to the time variations in the reference clock signal of the input data RDATA.

As described in greater detail with reference to FIG. 12, the window and data regenerator 90 generates a window signal RDW and a regenerated data signal RDD utilizing the MATCH signal from the comparator 60 and the SAVDPLS signal from the edge detector 10. The window signal RDW designates the type of the regenerated data pulse RDD. When RDW is high, the corresponding RDD pulse represents actual data, otherwise RDD represents the reference clock pulse.

Edge Detector 10

Figure 3:
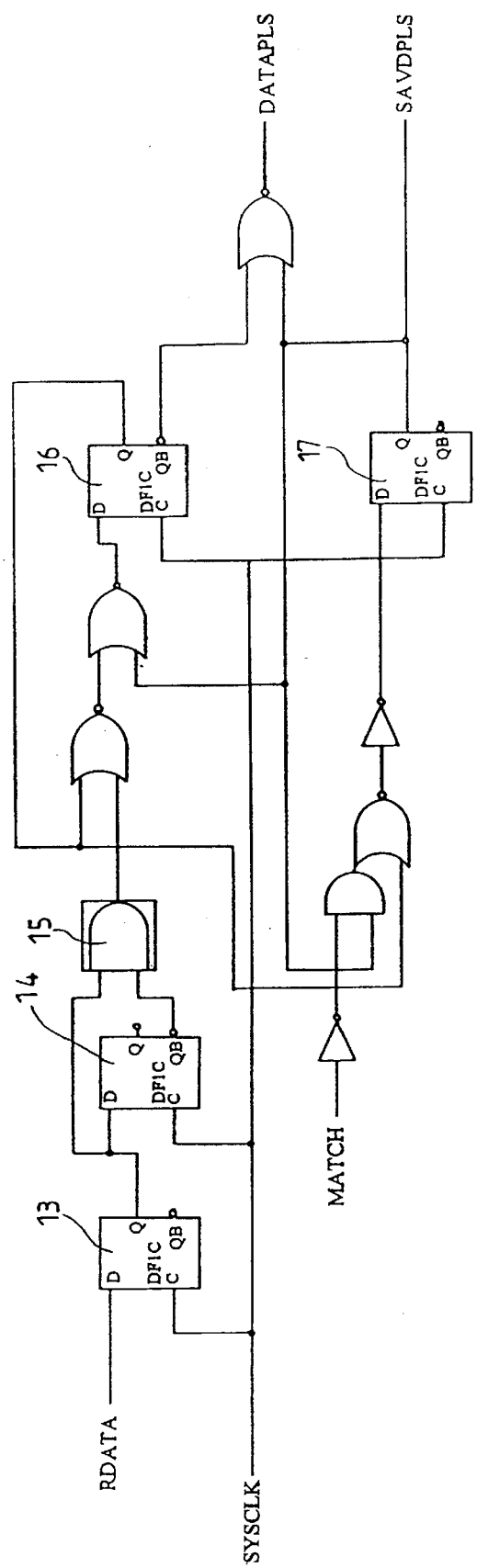
FIG. 3 is a schematic block diagram of the edge detector of the improved digital phase-locked loop of FIG. 1.

FIG. 3 shows the structure of the detector 10. The edge detector 10 receives the input data RDATA at the system clock input SYSCLK of a register 13, which is followed by another register 14. Register 13 samples the input RDATA, converting its rising edge to be synchronous with the system clock SYSCLK. With the outputs from registers 13 and 14, an AND gate 15 generates a pulse at the rising edge of the input RDATA. The output pulse generated by the AND gate 15 is delayed for one SYSCLK cycle by register 16 and is output as DATAPLS.

Figure 4:
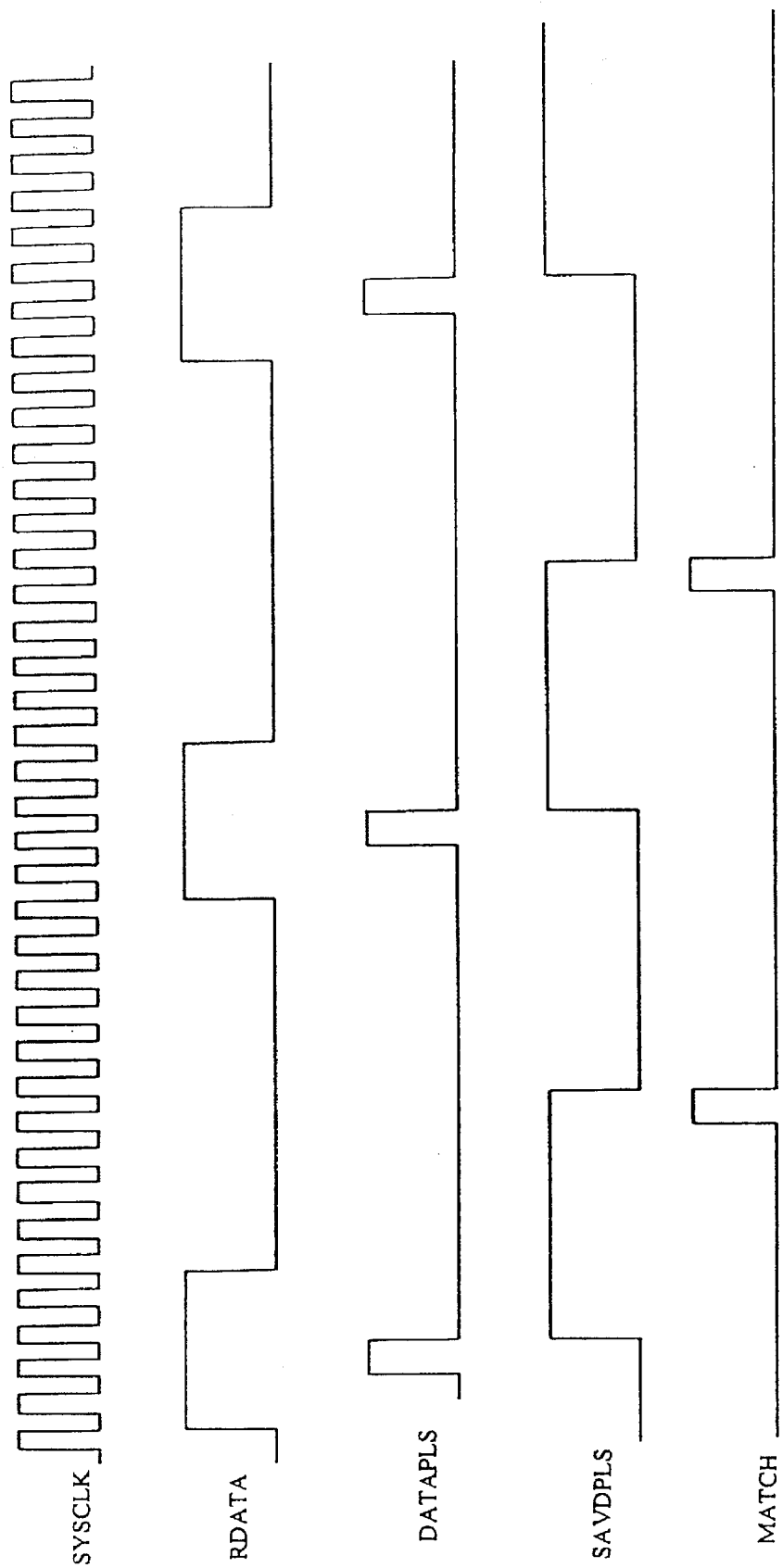
FIG. 4 is timing diagrams of the input and output signals of the edge detector of the improved digital phase-locked loop of FIG. 1.

The DATAPLS pulse is delayed one system clock by a register 17, the output of which is the SAVDPLS signal. After SAVDPLS goes high, it will remain high while resetting DATAPLS. SAVDPLS is reset to low when the MATCH pulse arrives. FIG. 4 shows the timing diagrams of SYSCLK, RDATA, DATAPLS, SAVDPLS and MATCH in order to help better understand the operation of the edge detector 10.

Input Phase Register 20

FIG. 5 shows structure of the input phase register 20. The input phase register 20 consists of a 5-bit register 21, which is clocked by SYSCLK. When the DATAPLS pulse arrives, the register 21 is enabled and the oscillator phase signal X4~X0 from the digital oscillator 80 is latched by the 5-bit register 21. The output of the register 21 is the input phase T4~T0, which represents the phase of the input RDATA pulse and is sent to the phase detector 30 and the predict phase generator 50 for phase information processing. In the case when the actual data in the input RDATA is a zero, DATAPLS will not be produced and the phase value of the previous pulse in the input data RDATA stream is retained in the input phase register 20. As a result, the phase information of the present data is still available for the system to function properly.

Phase Detector 30

FIG. 6 shows the structure of the phase detector 30. The phase detector 30 includes a combinatorial logic unit 31, a ROM 32 and a comparator 33. The combinatorial logic unit 31 combines the input phase T4~T0 from the edge detector 20 with the fraction phase Y2~Y0 from the fraction latch 70 to form an 8bit phase signal F7~F0. ROM 32 stores the four boundary values in the phase space between the five states VERY EARLY, EARLY, NORMAL, LATE and VERY LATE. ROM 32 generates a boundary phase signal G7~G0 according to the first order predict phase S4~S0 from the digital low pass filter 40. The comparator 33 compares the 8-bit phase F7~F0 with the boundary phase G7~G0 and generates signals VERY EARLY, EARLY, NORMAL, LATE and VERY LATE which are applied as inputs to the digital low pass filter 40.

Digital Low Pass Filter 40

Figure 7:
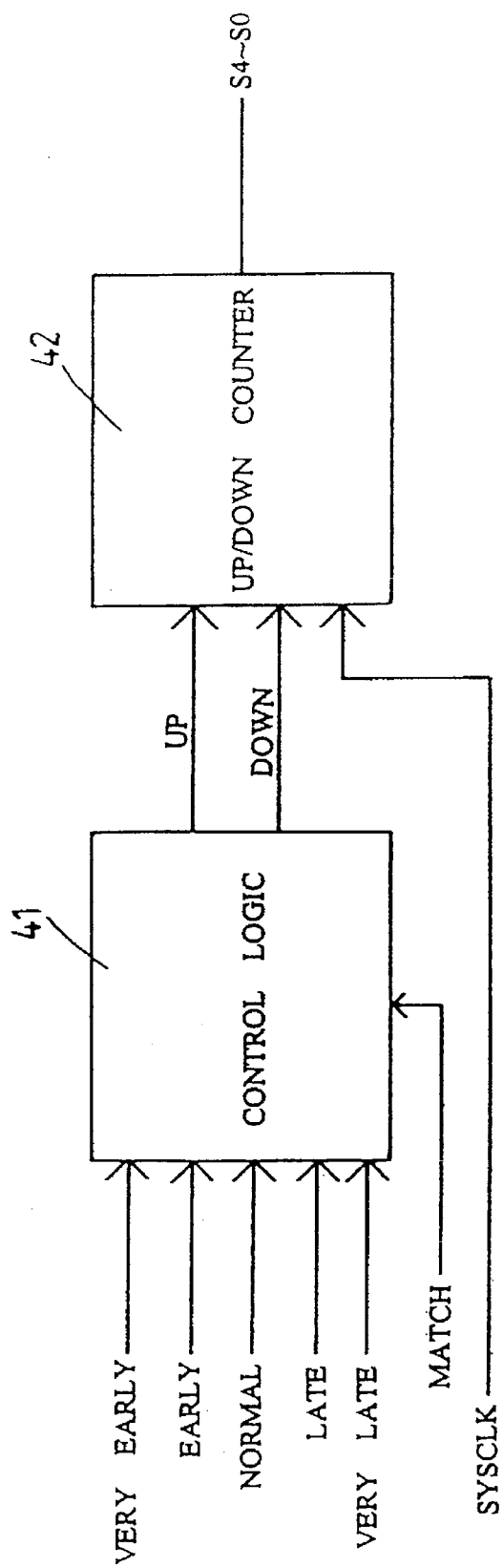
FIG. 7 is a schematic block diagram of the digital low pass filter of the improved digital phase-locked loop of FIG. 1.

FIG. 7 shows the structure of the digital low pass filter 40. The digital low pass filter 40 generates the first order predict phase signal S4~S0, which can be adjusted to accommodate for the time variations in the reference clock encoded in the input data RDATA. The digital low pass filter 40 includes a control logic unit 41 and an up/down counter 42. The control logic unit 41 generates an UP or a DOWN signal, according to the MATCH signal from the comparator 60 and the input signals VERY EARLY, EARLY, NORMAL, LATE and VERY LATE, in order to control the up/down counter 42 to count upwards or downwards. This mechanism helps to filter out jitters or transient variations in the received reference clock signal. The output of the up/down counter 42 is the first order predict phase signal S4~S0, which is sent to the phase detector 30 and the predict phase generator 50.

Predict Phase Generator 50

FIG. 8 shows the structure of the predict phase generator 50. The predict phase generator 50 consists of a mapper 51, a pre-adjust generator 52 and an adder 53. The mapper 51 converts the first order predict phase S4~S0 to an 8-bit phase B7~B0. Pre-adjust generator first combines the input phase T4~T0 with the fraction phase Y2~Y0 to form an 8-bit phase and then compares the 8-bit phase with B7~B0 in a phase comparator as shown in FIG. 8 to generate a pre-adjust phase signal A7~A0. The adder 53 then adds A7~A0 to B7~B0 to generate the actual predict phase signal PRED7~0 for the digital oscillator.

Comparator 60

Figure 9:
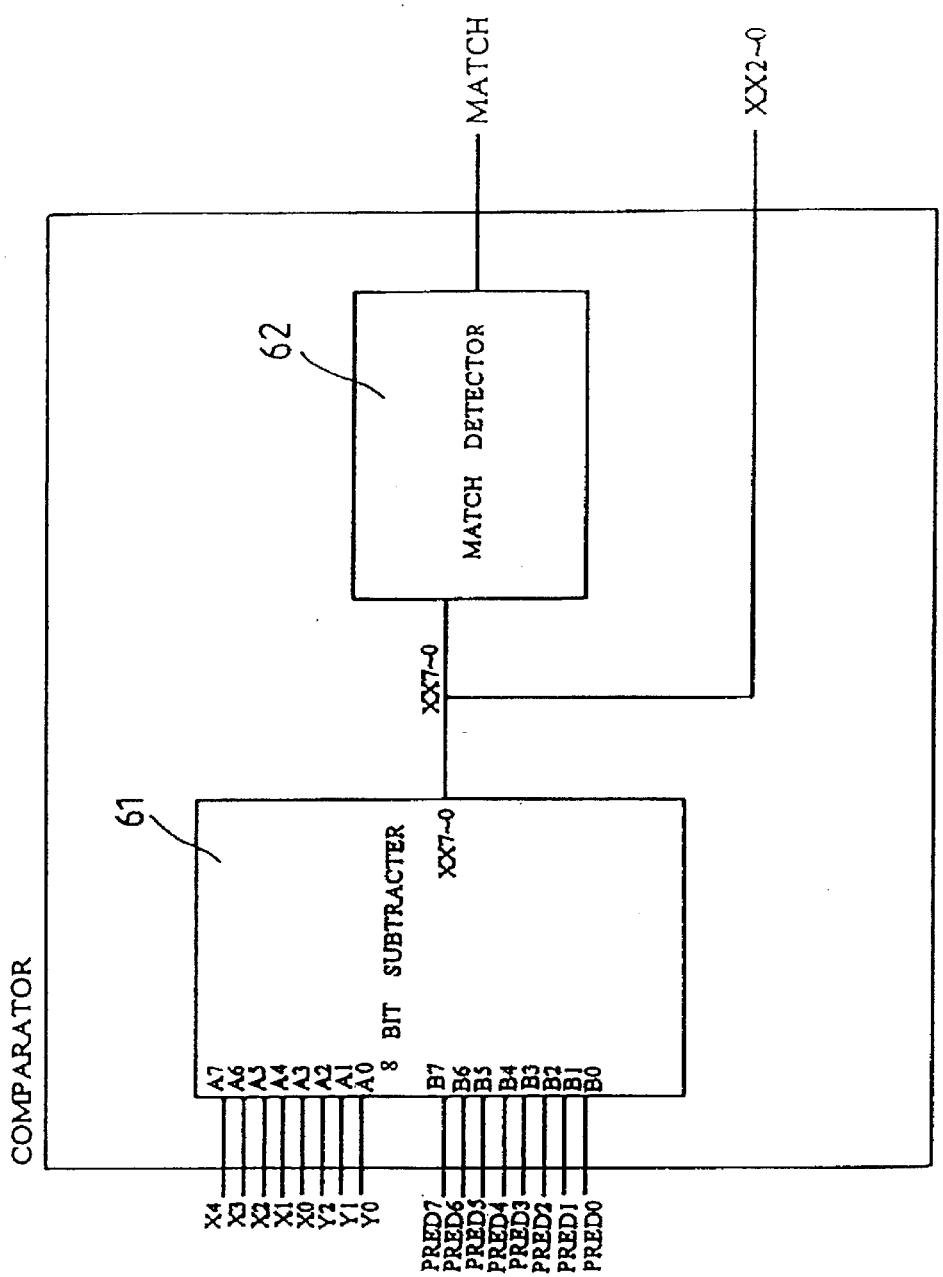
FIG. 9 is a schematic block diagram of the comparator of the improved digital phase-locked loop of FIG. 1.

FIG. 9 shows the structure of the comparator 60. The comparator 60 compares the counter output of the digital oscillator 80 with the predict phase PRED7~0 to check whether the phase of the digital oscillator 80 reaches or is close to the predict phase PRED7~0. The comparator 60 includes an 8-bit subtractor 61 and a match detector 62. The 8-bit subtractor 61 subtracts the combination of oscillator phase X4~X0 and fraction phase Y2~Y0 from the predict phase PRED7~0 and produces a difference phase signal XX7~XX0. The match detector 62 checks for the value of the phase difference XX7~XX0, when it is small enough, a MATCH signal is generated. The MATCH signal is used to reset the counter of the digital oscillator 80, which continues counting upwards thereafter.

Fraction Latch 70

FIG. 10 shows the structure of the fraction latch 70. The fraction latch 70 latches the three least significant bits XX2~XX0 at the pulse MATCH as fraction part of the predict phase. The result is stored as the fraction phase Y2~Y0 for adjusting the predict phase of the next cycle. As a result, the precision of the phase-locked loop is enhanced without increasing frequency of the system clock SYSCLK. The fraction latch 70 contains three D type flip flops 71, 72 and 73, respectively, and a few combinatorial logic gates. When MATCH is high, the phase difference XX2~XX0 are latched by the flip flops 71, 72 and 73, respectively. When MATCH is low, the values in the flip flops are fixed.

Digital Oscillator 80

FIG. 11 shows the structure of the digital oscillator 80. The digital oscillator 80 consists of a 5-bit up counter 81 that continuously counts upwards. When the MATCH pulse arrives the counter 81 is reset to zero and counts upwards again. Consequently, the counter 81 is equivalent to a digital oscillator with a period that is adjusted according to the relative phase of the input data stream RDATA. The counter output value X4~X0 of the counter 81 represents present phase of the digital oscillator and is sent to the input phase register 20 in order to sample the phase of the input data pulse RDATA relative to the digital oscillator 80. With the combination of the digital oscillator 80 and the comparator 60, the digital phase-locked loop can generate a pulse train of MATCH that corresponds to the input data stream.

Window and Data Regenerator 90

Figure 12:
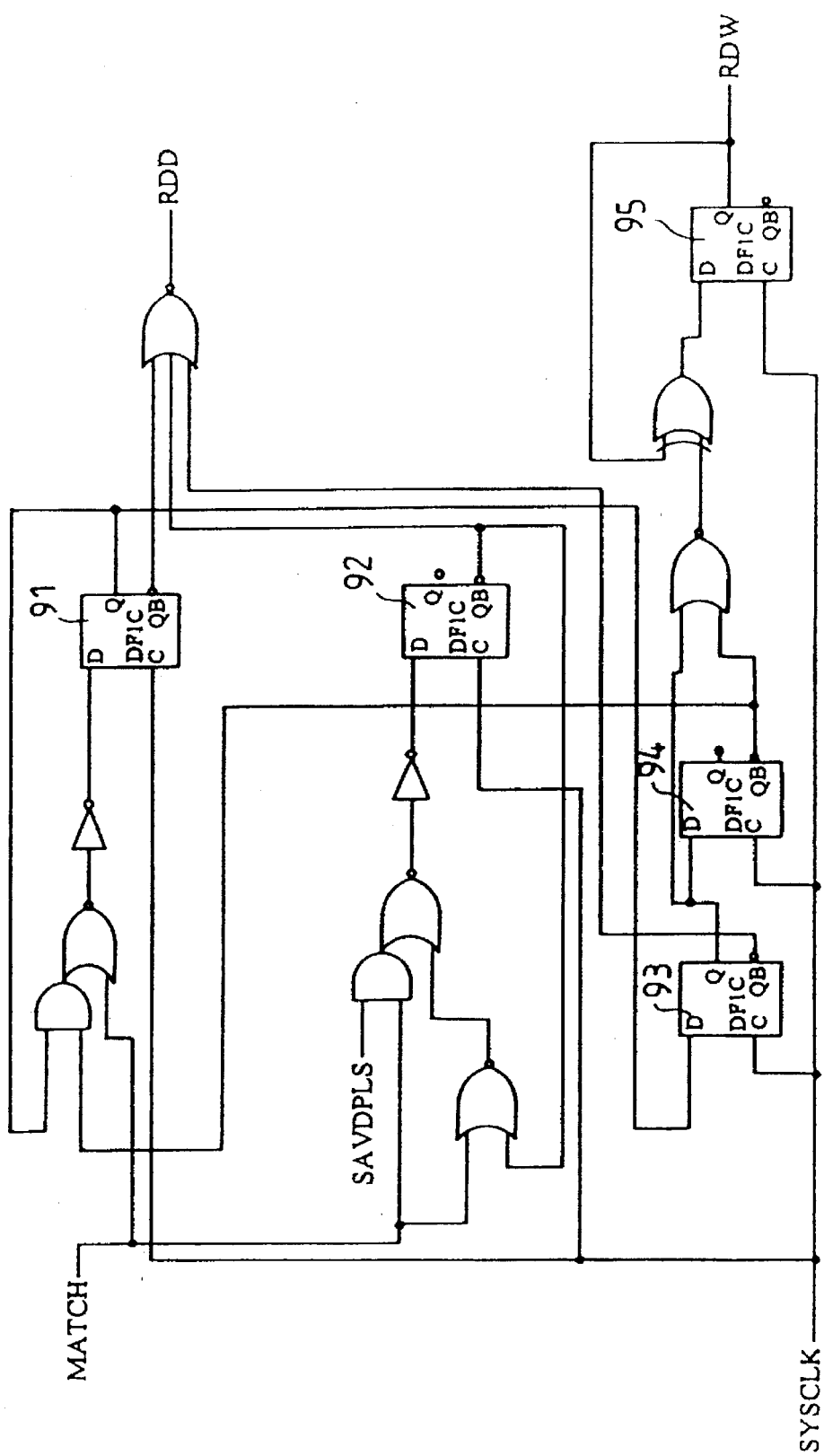
FIG. 12 is a schematic block diagram of the window and data regenerator of the improved digital phase-locked loop of FIG. 1.
Figure 13:
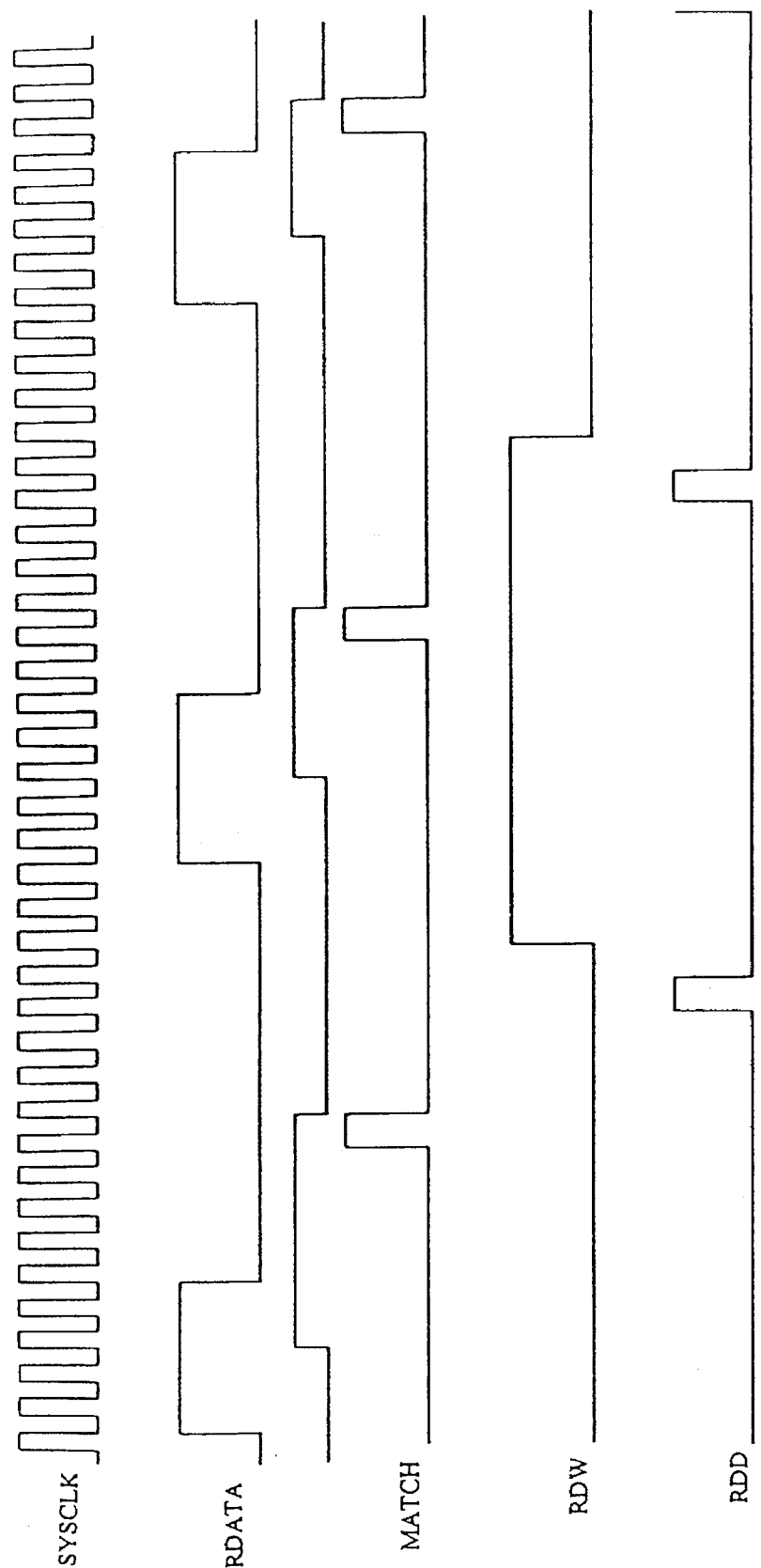
FIG. 13 is timing diagrams of the input data stream and window and data regenerator outputs in order to provide a better understanding of the operation of the improved digital phase-locked loop of the invention.

FIG. 12 shows the structure of the window and data regenerator 90. The window and data regenerator 90 generates the window signal RDW and the data signal RDD. RDD is a pulse train that is the combination of the reference clock and the data pulse, both of which have been adjusted to be more evenly spaced in time. The window signal RDW designates the type of the pulses in RDD. When RDW is high, the pulse in RDD represents the regenerated actual data, otherwise RDD represents the recovered reference clock. As a result, RDW and RDD combined can help separating the actual data from the reference clock.

The window and data regenerator 90 includes D type flip flops 91 to 95. The flip flops 91, 93 and 94 constitutes a counter that delays the MATCH pulse for five system clocks and forces the flip flop 95 to toggle its state. The output signal RDW of the flip flop 95 thus switches between "0" and "1", indicating that the data signal and the reference clock signal are stored alternately. The flip flops 91, 93 and 94 also delay the MATCH pulse for three system clocks to generate an RDD pulse. As a result, the RDD signal is synchronized to the RDW signal. The sign of RDD pulse is determined by the flip flop 92, which latches the value of SAVDPLS at the MATCH pulse and saves the SAVDPLS data in order to produce correct data RDD.

What is claimed is:

1. A digital phase-locked loop for generating separated data and clock signals from an encoded input data stream that includes data and reference clock pulses, said digital phase-locked loop comprising:

an edge detector for detecting the rising edge in the input data stream, said edge detector producing DATAPLS and SAVDPLS signals, said DATAPLS signal being sent to an input phase register and said SAVDPLS signal being sent to a window and data generator;

said input phase register latching the phase value of a digital oscillator, said latched oscillator phase value representing phase of said input data stream, said latched oscillator phase being sent to a phase detector and a predict phase generator;

said phase detector comparing the combination of said latched oscillator phase and a fraction phase with a first order predict phase and generating VERY EARLY, EARLY, NORMAL, LATE and VERY LATE signals for adjusting a digital low pass filter;

said digital low pass filter generating said first order predict phase according to said VERY EARLY, EARLY, NORMAL, LATE and VERY LATE signals;

said predict phase generator generating a final predict phase from said first order predict, said latched oscillator phase and said fraction phase, said final predict phase being sent to a comparator for controlling said digital oscillator;

said comparator generating a MATCH signal from said final predict phase, said fraction phase and a count value of said digital oscillator, said MATCH signal being used to reset an up counter in said digital oscillator and sent to a fraction latch;

said fraction latch latching the difference between the phase value of said digital oscillator and said final predict phase, said difference of phase being stored as said fraction phase;

said digital oscillator including an up counter, said up counter generating integer part of the phase value of said digital oscillator, said up counter further being reset by said MATCH signal and counting upwards thereafter;

and said window and data regenerator generating a window signal and a data signal, said window signal and data signal being used to separate said reference clock pulses and said data of said input data stream.

2. The digital phase-locked loop of claim 1, in which said phase detector includes a ROM unit, a comparator and a combinatorial logic unit, said ROM unit storing the four boundary values between the five signals VERY EARLY, EARLY, NORMAL, LATE and VERY LATE corresponding to said first order predict phase generated by said digital low pass filter, said combinatorial logic unit combining said latched oscillator phase and said fraction phase, said comparator comparing said combined phase with said boundary values and generating said VERY EARLY, EARLY, NORMAL, LATE and VERY LATE signals.

3. The digital phase-locked loop of claim 1, in which said digital low pass filter includes a control logic unit and a up/down counter, said control logic unit generating upwards or downwards counting command according to inputs from said phase detector, said up/down counter counting upwards or downwards to change said first order predict phase.

4. The digital phase-locked loop of claim 1, in which said predict phase generator includes a mapper, a pre-adjust generator and an adder, said mapper converting said first order predict phase to an 8-bit mapped phased, said pre-adjust generator first combining said latched oscillator phase with said fraction phase to form an 8-bit phase and then comparing said 8-bit phase with said mapped phase to generate an adjust phase, said adder adding said phase to said 8-bit mapped phase to generate said final predict phase.

5. The digital phase-locked loop of claim 1, in which the window and data regenerator includes five flip flops and combinatorial logic gates, said flip flops generating said window signal according to said MATCH signal, said flip flops further generating regenerated data signal according to said MATCH signal and said SAVDPLS signal, said regenerated data signal being synchronized to said window signal.

* * * * *